US012665555B2

(12) United States Patent　　　　　　　(10) Patent No.:　US 12,665,555 B2

Li et al.　　　　　　　　　　　　　　　　(45) Date of Patent:　Jun. 23, 2026

(54) RADIO FREQUENCY POWER AMPLIFIER THAT REDUCES LOAD CHANGE SENSITIVITY, CHIP, AND COMMUNICATION TERMINAL

(71) Applicant: VANCHIP (TIANJIN) TECHNOLOGY CO., LTD., Tianjin (CN)

(72) Inventors: Haihui Li, Tianjin (CN); Yunfang Bai, Tianjin (CN)

(73) Assignee: VANCHIP (TIANJIN) TECHNOLOGY CO., LTD., Tianjin (CN)

( * ) Notice: Subject to any disclaimer, the term of this patent is extended or adjusted under 35 U.S.C. 154(b) by 438 days.

(21) Appl. No.: 18/340,842

(22) Filed: Jun. 24, 2023

(65) Prior Publication Data

US 2023/0336134 A1　　Oct. 19, 2023

Related U.S. Application Data

(63) Continuation of application No. PCT/CN2021/140432, filed on Dec. 22, 2021.

(30) Foreign Application Priority Data

Dec. 24, 2020　(CN) .......................... 202011552738.0

(51) Int. Cl.
　*H03F 1/22*　　　(2006.01)
　*H03F 1/34*　　　(2006.01)
　*H03F 3/24*　　　(2006.01)

(52) U.S. Cl.
　CPC ............... *H03F 3/245* (2013.01); *H03F 1/34* (2013.01); *H03F 2200/135* (2013.01); *H03F 2200/451* (2013.01)

(58) Field of Classification Search
　CPC ................................... H03F 1/22; H03F 3/191
　USPC .................................................... 330/310, 302
　See application file for complete search history.

(56) References Cited

U.S. PATENT DOCUMENTS

| | | | | |
|---|---|---|---|---|
| 6,476,679 B2 * | 11/2002 | Kakuta | ................... | H03F 1/086 |
| | | | | 330/98 |
| 6,498,535 B1 * | 12/2002 | Allen | ...................... | H03F 1/565 |
| | | | | 330/307 |
| 6,630,861 B2 * | 10/2003 | Kawaoka | ............... | H03G 1/007 |
| | | | | 330/285 |
| 6,680,647 B2 * | 1/2004 | Brown | ...................... | H03F 3/72 |
| | | | | 330/53 |
| 6,940,354 B2 * | 9/2005 | Kang | ...................... | H03F 3/605 |
| | | | | 330/310 |
| 11,848,650 B2 * | 12/2023 | Xie | ........................... | H03F 3/26 |

* cited by examiner

*Primary Examiner* — Henry Choe

(74) *Attorney, Agent, or Firm* — George Guosheng Wang; Upstream Research and Patent LLC

(57) ABSTRACT

Disclosed is a radio frequency power amplifier that reduces load change sensitivity, which comprises a feedback circuit (10) and a plurality of levels of amplification circuit, the feedback circuit (10) and all or a portion of amplification circuit among the plurality of levels of amplification circuit being connected in parallel between a first node (M) and a second node (N), and a feedback loop made up of the feedback circuit (10) and an amplification circuit main path located between the first node (M) and the second node (N) forming a 180°+360°×n phase shift, where n is a natural number.

8 Claims, 5 Drawing Sheets

RADIO FREQUENCY POWER AMPLIFIER THAT REDUCES LOAD CHANGE SENSITIVITY, CHIP, AND COMMUNICATION TERMINAL

BACKGROUND

Technical Field

The present disclosure relates to a radio frequency power amplifier that reduces load change sensitivity, and also relates to an integrated circuit chip including the radio frequency power amplifier and a corresponding communication terminal, and belongs to the technical field of radio frequency circuits.

Related Art

In wireless communication equipment, the radio frequency power amplifier amplifies the power of the transmitted signal, switches it to the antenna end, and converts the transmitted signal into electromagnetic wave through the antenna. With the development of mobile phones towards ultra-thin, ultra-light and all-screen, the mobile phone antenna is generally designed at the position of the mobile phone frame, and the handheld state and surrounding environment more significantly affect the load of the mobile phone antenna feed end. The change of antenna load not only changes the radiation efficiency of the antenna, but also changes the equivalent load of the radio frequency power amplifier, which makes the available power output of the radio frequency power amplifier fluctuate greatly, and then affects the total radiation power (TRP).

At present, there are many solutions for the total radiation power of the antenna. The first scheme is to set a power detector at the output end of the radio frequency power amplifier, which is used to transmit the information of the output power of the radio frequency power amplifier to the power controller in the form of voltage or current through the feedback circuit, and then control the collector voltage or base current of the power amplifier circuit to achieve the purpose of optimizing power control. This scheme is generally used to switch between different power levels.

The second scheme is to increase the detection of the input power of the radio frequency power amplifier on the basis of the first scheme. For example, the radio frequency power amplifier is compared with its output power according to its gain at a load impedance of 50 ohm. When the output power of the radio frequency power amplifier is higher than a certain threshold of the calibration value, the gain of the radio frequency power amplifier is reduced by reducing its base bias current or collector voltage, so as to reduce its output power. When the output power is lower than a certain threshold of the calibration value, the gain of the radio frequency power amplifier is improved by increasing the base bias current. This scheme needs to detect the input power and output power of radio frequency power amplifier at the same time, and needs a register to store the calibration value of output power, which increases the complexity of the implementation circuit and the chip area.

SUMMARY

The primary technical problem to be solved by the present disclosure is to provide a radio frequency power amplifier that reduces load change sensitivity.

Another technical problem to be solved by the present disclosure is to provide an integrated circuit chip including the radio frequency power amplifier and a communication terminal.

In order to achieve the above objectives, the present disclosure adopts the following technical solutions:

According to a first aspect of the embodiment of the present disclosure, there is provided a radio frequency power amplifier, comprising a feedback circuit and a plurality of levels of amplification circuit, the feedback circuit and all or a portion of amplification circuit among the plurality of levels of amplification circuit being connected in parallel between a first node and a second node, and a feedback loop made up of the feedback circuit and an amplification circuit main path located between the first node and the second node forming a $180°+360°\times n$ phase shift, where n is a natural number.

Preferably, a radio frequency current input to the first node and a feedback current output from the feedback circuit to the first node are in reverse phase under a predetermined load impedance.

Preferably, when the load impedance changes, a current of the radio frequency power amplifier flowing to the feedback circuit at the second node fluctuates, and changing a phase of the feedback current at the first node is equivalent to dynamically adjusting a size of a combined net input current.

Preferably, one end of the feedback circuit and an output end of a penultimate stage amplification circuit being connected to the second node, and under a condition that the feedback loop forming a $180°+360°\times n$ phase shift, the other end of the feedback circuit is connected to the first node with the input end of a certain stage amplification circuit in front of the penultimate stage amplification circuit.

Or, one end of the feedback circuit and an output end of a penultimate stage amplification circuit being connected to the second node, and under a condition that the feedback loop forming a $180°+360°\times n$ phase shift, the other end of the feedback circuit is connected to the first node with the output end of a certain stage amplification circuit in front of the penultimate stage amplification circuit.

Preferably, one end of the feedback circuit and an output end of the last stage amplification circuit being connected to the second node, and under a condition that the feedback loop forming a $180°+360°\times n$ phase shift, the other end of the feedback circuit is connected to the first node with the output end of a certain stage amplification circuit in front of the last stage amplification circuit.

Or, one end of the feedback circuit and an output end of the last stage amplification circuit being connected to the second node, and under a condition that the feedback loop forming a $180°+360°\times n$ phase shift, the other end of the feedback circuit is connected to the first node with the input end of a certain stage amplification circuit in front of the last stage amplification circuit.

Preferably, each stage of amplification circuit is composed of amplification devices, and adjacent amplification circuits are connected in series with interstage capacitance.

Preferably, two stage amplification devices are arranged between the first node and the second node to form a 360° phase shift.

Preferably, the interstage capacitance between the first node and the second node and a feedback capacitance in the feedback circuit form a 180° phase shift.

According to a second aspect of the embodiment of the present disclosure, there is provided an integrated circuit chip, which comprises the radio frequency power amplifier to reduce load change sensitivity.

According to a third aspect of the embodiment of the present disclosure, there is provided a communication terminal, which comprises the radio frequency power amplifier to reduce load change sensitivity.

The radio frequency power amplifier reducing load change sensitivity provided by the present disclosure adds a feedback circuit on the basis of the existing radio frequency power amplifier. The feedback circuit uses passive components and selects appropriate feedback points. On the basis of 360° phase shift formed by the amplification devices between the feedback loops, the feedback loop is used to form $180°+360°\times n$ phase shift, so as to stabilize the output power of the radio frequency power amplifier, reduce the sensitivity of the radio frequency power amplifier to the change of load, so as to well stabilize the total radiation power of the radio frequency power amplifier under the change of load.

DETAILED DESCRIPTION

Figure 1:
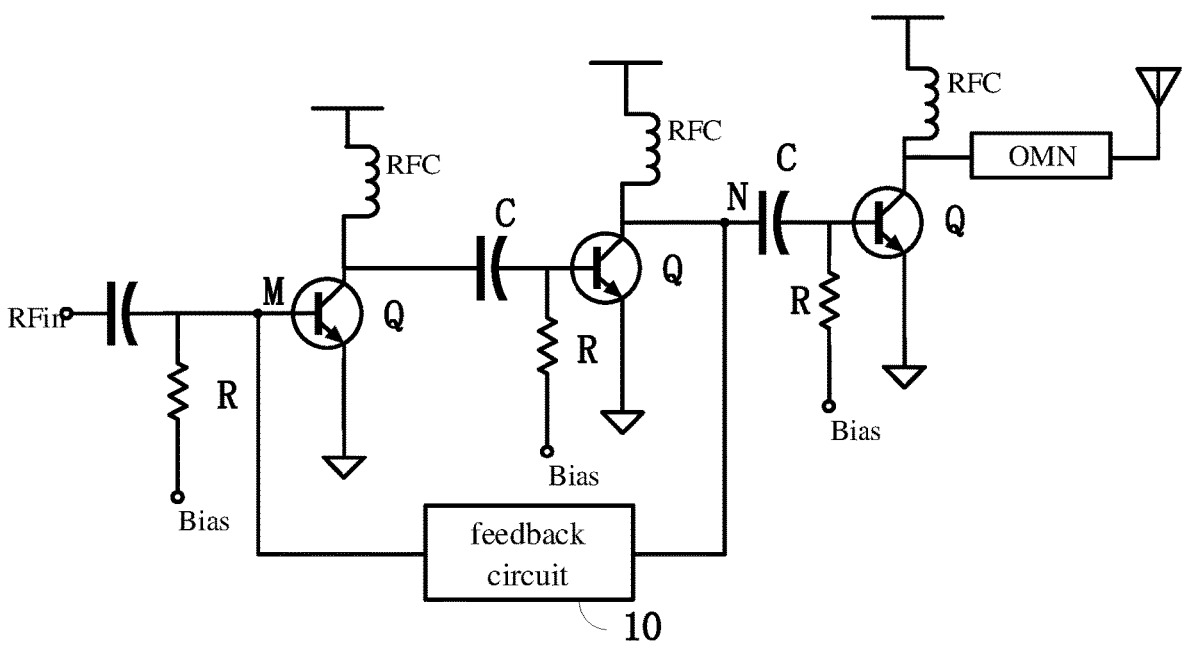
FIG. 1 is a schematic diagram of the radio frequency power amplifier that reduces load change sensitivity provided by embodiment 1 of the present disclosure.

The technical content of the present disclosure will be further described below in combination with the accompanying drawings and specific embodiments.

In order to reduce the sensitivity of radio frequency power amplifier to load change, that is, to stabilize the output power of radio frequency power amplifier under load change, and then to stabilize the total radiation power of radio frequency power amplifier. An embodiment of the present disclosure provides a radio frequency power amplifier to reduce load change sensitivity. The radio frequency power amplifier comprises a feedback circuit and a plurality of levels of amplification circuit (also as multi-stage amplification circuit). The feedback circuit is connected in parallel with all or a portion of amplification circuit among the plurality of levels of amplification circuit at the first node and the second node, and the feedback loop formed by the main path of the amplifier circuit and the feedback circuit is located between the first node and the second node, and forms a $180°+360°\times n$ phase shift, where n is a natural number.

In this radio frequency power amplifier, the radio frequency current input to the first node and the current output by the feedback circuit to the first node are in phase reversal at a predetermined load impedance (for example, 50 ohm, or other values such as 25 ohm, 100 ohm, etc.). When the load impedance changes, according to the shunt principle, the current flowing to the feedback circuit of the radio frequency power amplifier at the second node will fluctuate, and then change the phase of the feedback current at the first node, which is equivalent to dynamically adjusting the size of the synthetic net input current. This is equivalent to dynamically adjusting the gain of the radio frequency power amplifier, so as to stabilize the output power of the radio frequency power amplifier and reduce load change sensitivity of the radio frequency power amplifier.

In the embodiment of the present disclosure, each stage of the amplifier circuit comprises an amplifier member. Among them, the amplifier member can be a transistor, MOS tube, and other types of three-terminal sub-devices. As shown in FIG. 1, FIG. 3 to FIG. 8, for example, each level of amplifier circuit consists of a transistor Q. The collector of the transistor Q is connected to the supply voltage through the RFC inductor, the emitter of the transistor Q is grounded, and the base of the transistor Q is connected to the bias circuit Bias through the bias resistor R.

In the following, the positions of the first node and the second node connected between the feedback circuit and the radio frequency power amplifier are described in detail in combination with different embodiments and taking the example that each stage of the amplification circuit is composed of transistor.

Embodiment 1

The radio frequency power amplifier provided by this embodiment comprises a feedback circuit and a plurality of levels of amplification circuit. A feedback loop made up of the feedback circuit and an amplification circuit main path located between the first node and the second node forming a $180°+360°\times n$ phase shift. One end of the feedback circuit is connected to the output end of the penultimate stage amplification circuit (i.e. the previous stage amplification circuit of the last stage amplification circuit) at the second node. When the feedback loop is satisfied, $180°+360°\times n$ phase shift, the other end of the feedback circuit is connected to the input end of a certain stage amplification circuit in front of the penultimate stage amplification circuit to the first node. Here, the advantage of connecting one end of the feedback circuit and the output end of the penultimate stage amplifier circuit to the second node is that the influence of the feedback circuit on its load can be reduced as much as possible.

In the embodiment of the present disclosure, the number of amplification circuits in the plurality of levels of amplification circuit is not less than 3, and the cascade mode is adopted between them. As shown in FIG. 1, the radio frequency power amplifier provided by this embodiment comprises a three-stage amplification circuit and a feedback circuit 10. One end of the feedback circuit 10 is connected to the second node n with the output end of the second stage amplification circuit, and forms a $180°+360°×n$ phase shift, the other end of the feedback circuit 10 and the input end of the first stage amplification circuit are connected to the first node M.

The radio frequency signal is input to the first stage amplification circuit after passing through the DC isolation capacitor. The output end of the last stage amplification circuit of the radio frequency power amplifier is connected to the external antenna through the output matching circuit OMN, and the radio frequency signal is converted into electromagnetic wave and transmitted through the antenna.

In multi-stage amplification circuit, in order to achieve the purpose of direct isolation or matching, the adjacent amplifier circuits must be connected in series with interstage capacitors. For each interstage capacitor connected in series between adjacent amplifier circuits, the phase of the current will lead the voltage by 90°. Therefore, it is necessary to ensure that two-stage transistor Q is set between the first node m and the second node n, and 360° phase shift is formed through the two-stage transistor Q.

Figure 2:
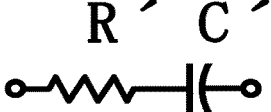
FIG. 2 is a schematic diagram of the feedback circuit in the radio frequency power amplifier that reduces load change sensitivity provided by embodiment 1 of the present disclosure.

The feedback circuit 10 may consist of only feedback capacitor. In order to debug the feedback quantity of the feedback circuit 10, as shown in FIG. 2, the feedback circuit 10 can also be connected in series with a resistor R' on the basis of the feedback capacitor C'. In addition, on the premise of ensuring that the feedback amount of the feedback circuit 10 is as small as possible, the feedback circuit 10 can also be composed of feedback capacitors, resistors and inductors in series. For example, the feedback circuit 10 can be composed of two feedback capacitors, a resistor and an inductor in series. The feedback amount of the feedback circuit 10 should be as small as possible. The purpose of this setting is to prevent excessive feedback from reducing the output power of the radio frequency power amplifier under the predetermined load impedance, and to reduce the probability of oscillation due to inappropriate circuit parameter settings.

In order to make the two-stage transistor Q, the interstage capacitance between the two-stage transistor Q and the feedback circuit 10 between the first node M and the second node N form a feedback loop to achieve negative feedback, it is necessary to ensure that the interstage capacitance between the two-stage transistor Q and the feedback capacitance of the feedback circuit 10 are combined to form $180°+360°×n$ phase shift. Moreover, on the premise of ensuring that the feedback loop is negative feedback, the number of feedback capacitors of the feedback circuit 10 can be further adjusted. For example, when the number of interstage capacitors between the two-stage transistor Q between the first node M and the second node N is two, the number of feedback capacitors in the feedback circuit 10 should be two.

Figure 3:
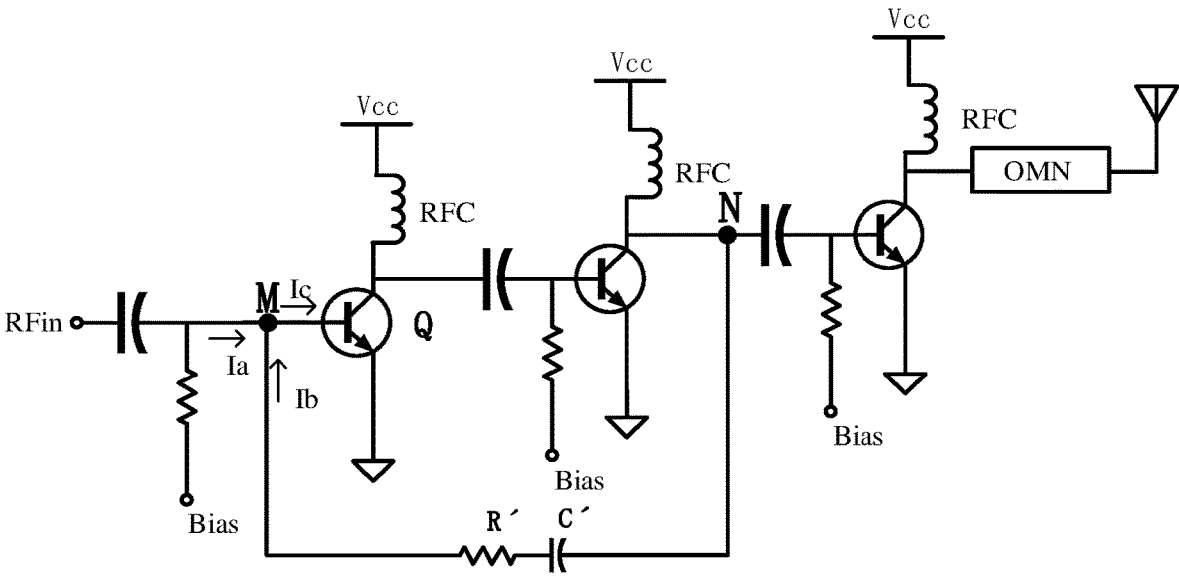
FIG. 3 is a theoretical analysis diagram of the radio frequency power amplifier that reduces load change sensitivity provided by embodiment 1 of the present disclosure.

As shown in FIG. 3, in the radio frequency power amplifier provided by this embodiment, Ia is an input current, Ib is the feedback current from the feedback circuit 10 to the first node M, and Ic is a combined net input current from the base of the transistor Q input to the first stage amplification circuit. Wherein, the input current Ia and feedback current Ib are reversed at a predetermined load impedance (such as 50 ohm), and the combined net input current Ic entering the transistor Q will be slightly reduced. When the actual load impedance changes, the output current of the third stage amplification circuit will fluctuate violently, changing the impedance of the second node n close to the antenna side (as shown in FIG. 3, the impedance of the second node to the right), thus changing the phase of the feedback current Ib, which is equivalent to dynamically adjusting the size of the synthetic net input current Ic. It is equivalent to dynamically adjusting the gain of the radio frequency power amplifier, so as to stabilize the output power of the radio frequency power amplifier and reduce load change sensitivity of the radio frequency power amplifier.

The working principle of the radio frequency power amplifier provided by this embodiment will be further explained by taking the 2G communication network communication of the mobile phone as an example.

Figure 4:
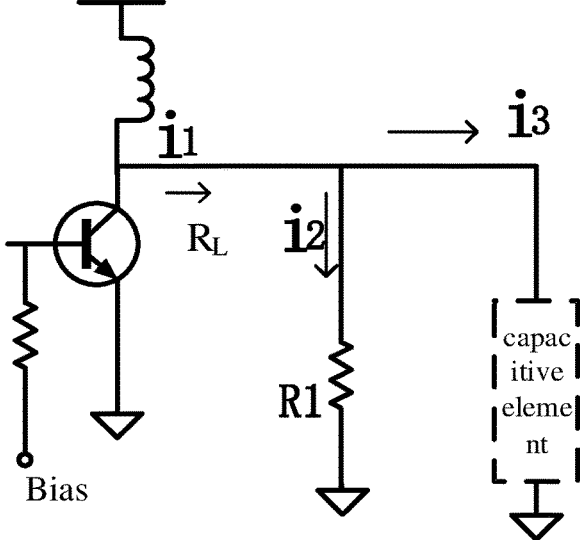
FIG. 4 is an analysis diagram of modeling the load change in the radio frequency power amplifier that reduces the sensitivity to load change provided by the embodiment of the present disclosure.

As shown in FIG. 4, firstly, the load change of the radio frequency power amplifier is modeled. The load change is equivalent to paralleling a virtual inductive or capacitive element on the original load R1 to flow a current i3 through the virtual inductive or capacitive element. The current i3 can be positive or negative to reflect the current change after the load impedance changes. The virtual element exists to simulate the change of load impedance.

Specifically, when the predetermined load impedance is 50 ohm, the current i3 flowing through the virtual capacitive element is 0, and the current i1 flowing from the transistor Q collector is i2 flowing into the load R1. At this time, $R_L=V_B/i_1=V_B/i_1=R1$ and $R_L$ is the load seen from the transistor Q, where $V_B$ is the voltage at the output of the transistor Q collector.

When the mobile phone sends the GMSK modulated signal to the 2G base station, the radio frequency power amplifier outputs saturated power. When the load impedance changes, such as holding a mobile phone to make a call, the antenna load impedance changes, which is equivalent to paralleling a virtual capacitive element next to the load. At this time, the current i3 flowing through the virtual capacitive element is not equal to 0, $R_L$ is the load seen from the transistor Q and $R_L=V_B/i_1=V_B/(i_2+i_3)$. When the current i3 flowing through the virtual capacitive element is greater than 0, the load impedance becomes smaller. The output power of radio frequency power amplifier is increased; When the current i3 flowing through the virtual capacitive element is less than 0, the load impedance becomes larger and the output power of the radio frequency power amplifier decreases.

Figure 5:
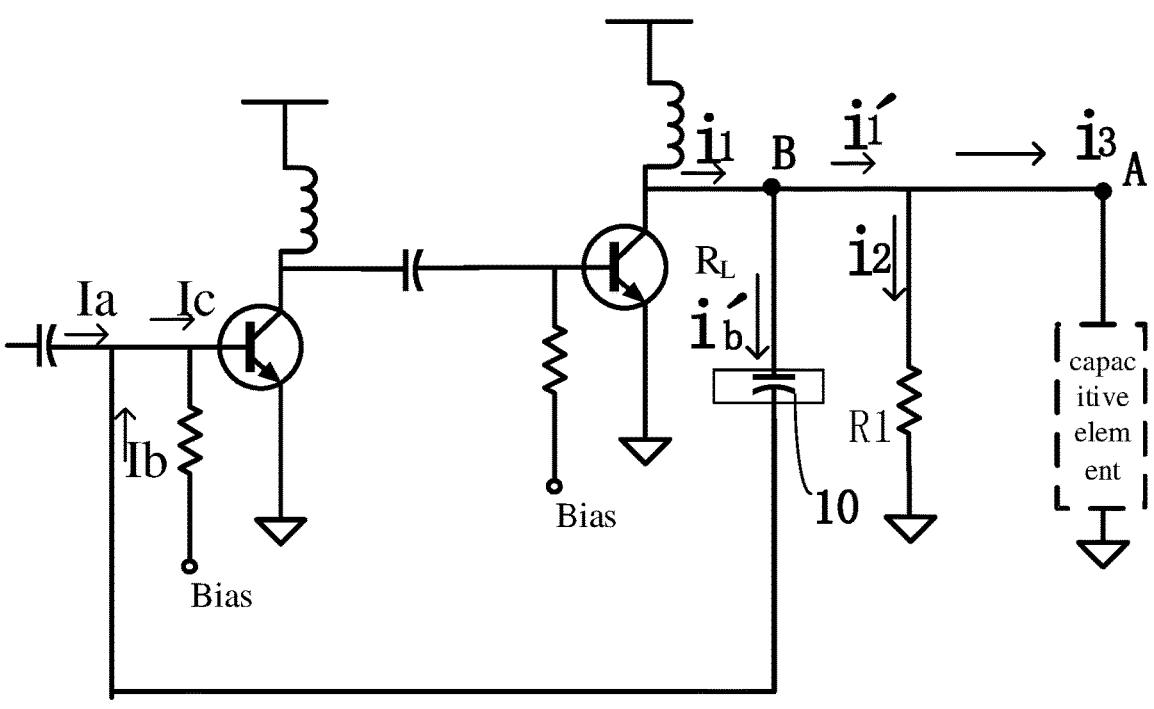
FIG. 5 is a schematic diagram of the analysis after adding a feedback circuit after modeling the load change in the radio frequency power amplifier that reduces the sensitivity to load change provided by the embodiment of the present disclosure.

As shown in FIG. 5, after modeling the change of radio frequency power amplifier load, add the feedback circuit 10. Ideally, the transient current flowing into the feedback circuit 10 $i_b'=-i_3$, the current flowing from the collector of the transistor $i_1=i_1'+i_b'=i_2+i_3-i_3=i_2$, the load $R_L=V_B/i_1=R1$ seen from the transistor remains unchanged. Where, $i_1'$ is the current flowing to the total load, including the current i2 flowing to the load R1 and the transient current Ib flowing to the inductive element i3. The transient current $i_b'$ flowing into the feedback circuit 10 changes with the load impedance because the presence of the virtual capacitive element at node A changes the impedance on the right side of node B. The transient current $i_b'$ is generated according to the principle of shunt in parallel.

When the impedance on the right side of point B increases, the saturated power of the radio frequency power amplifier output decreases. According to the shunt principle, the transient current $i_b'$ decreases, that is, the phase of the feedback current Ib changes, which is in phase with the input current Ia, and the combined net input current Ic of the base of the transistor input to the first stage amplification circuit increases, that is, the net input signal of the radio frequency power amplifier increases, which is equivalent to the gain of the radio frequency power amplifier is increased, and the output power of the radio frequency power amplifier is increased, Thus, the output power is close to the rated power and the change of output power is weakened. When the impedance on the right side of point b decreases, the saturated power output of the radio frequency power amplifier increases. According to the shunt principle, the transient current $i_b'$ increases, the phase of the feedback current Ib does not change at this time, which is opposite to the phase of the input current Ia, but the feedback current Ib increases and the combined net input current Ic of the base of the transistor input to the first stage amplifier circuit decreases, that is, the net input signal of the radio frequency power amplifier decreases, which is equivalent to the gain of the radio frequency power amplifier being reduced. The output power of radio frequency power amplifier is reduced, which makes the output power close to the rated power and weakens the change of output power. From the above analysis, it can be seen that this circuit structure can stabilize the output power of the radio frequency power amplifier under load changes, reduce load change sensitivity of the radio frequency power amplifier, and thus stabilize the total radiation power of the radio frequency power amplifier.

Due to the large fluctuation range of the actual load impedance, the feedback cannot accurately make the transient current $i_b'=-i_3$. In practical application, as long as the transient current $i_b'$ existence can reduce the fluctuation range of radio frequency power amplifier output power and optimize the transient current $i_b'$ better results can be achieved. By adding the function that the negative feedback structure of the circuit can adjust the gain, the purpose of reducing the sensitivity of the radio frequency power amplifier to load changes and stabilizing the total radiated power of the radio frequency power amplifier can be achieved.

Embodiment 2

The difference between the radio frequency power amplifier provided in this embodiment and the radio frequency power amplifier provided in embodiment 1 is that one end of the feedback circuit is connected to the output end of the penultimate stage amplification circuit (the previous stage amplification circuit of the last stage amplification circuit) at the second node, under the condition that the feedback loop forming a 180°+360°×n phase shift, the other end of the feedback circuit is connected to the output end of a certain stage amplification circuit in front of the penultimate stage amplification circuit to the first node. Among them, the number of amplification circuits in the plurality of levels of amplification circuit shall not be less than 4.

Figure 6:
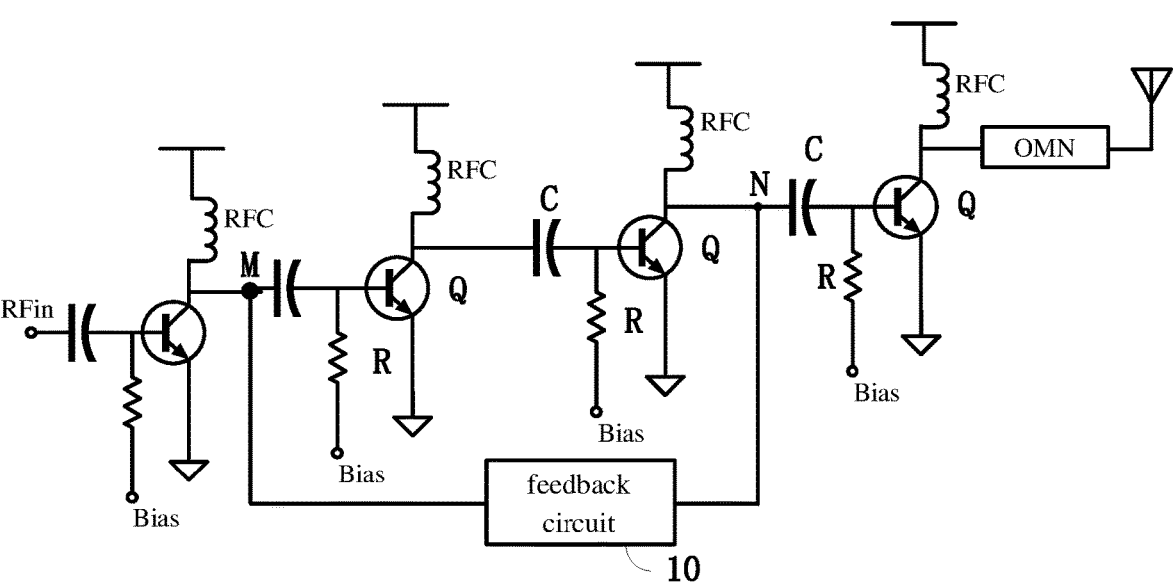
FIG. 6 is a schematic diagram of the radio frequency power amplifier that reduces load change sensitivity provided by embodiment 2 of the present disclosure.

As shown in FIG. 6, the radio frequency power amplifier provided by this embodiment comprises a four-stage amplification circuit and a feedback circuit 10. One end of the feedback circuit 10 is connected to the second node N with the output end of the third stage amplification circuit, and under the condition that the feedback loop forming a 180°+360°×n phase shift, the other end of the feedback circuit 10 and the output end of the first stage amplification circuit are connected to the first node M.

The structure of the feedback circuit 10 is the same as that of the feedback circuit 10 in embodiment 1. The working principle of the radio frequency power amplifier provided in this embodiment is the same as that in embodiment 1, and will not be repeated here.

Embodiment 3

The radio frequency power amplifier provided by this embodiment comprises a plurality of levels of amplification circuit and a feedback circuit. One end of the feedback circuit is connected to the output end of the last stage amplification circuit at the second node, and under the condition that the feedback loop forming a 180°+360°×n phase shift, the other end of the feedback circuit is connected to the output end of a certain stage amplification circuit in front of the last stage amplification circuit to the first node. Among them, the number of amplification circuits in the plurality of levels of amplification circuit shall not be less than 3.

Figure 7:
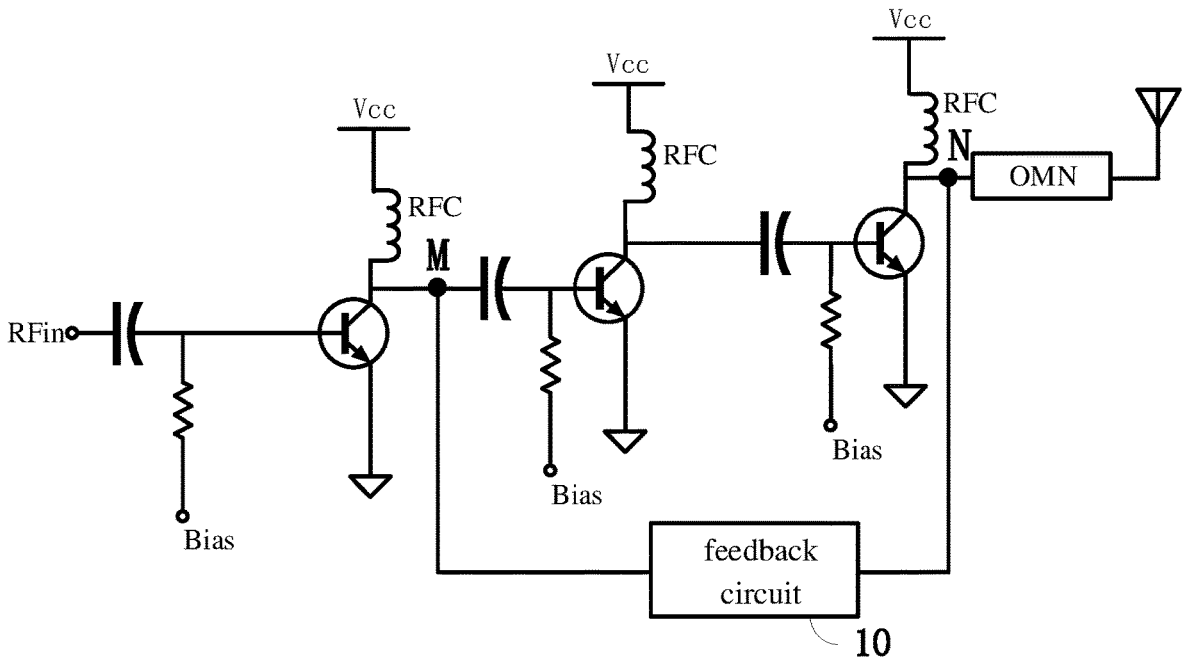
FIG. 7 is a schematic diagram of the radio frequency power amplifier that reduces load change sensitivity provided by embodiment 3 of the present disclosure.

As shown in FIG. 7, the radio frequency power amplifier provided by this embodiment comprises a three-stage amplification circuit and a feedback circuit 10. One end of the feedback circuit 10 is connected with the output end of the third stage amplification circuit to the second node N, and under the condition that the feedback loop forming a 180°+360°×n phase shift, the other end of the feedback circuit 10 and the output end of the first stage amplification circuit are connected to the first node M.

The structure of the feedback circuit 10 is the same as that of the feedback circuit 10 in embodiment 1. The working principle of the radio frequency power amplifier provided in this embodiment is the same as that in embodiment 1, and will not be repeated here.

Embodiment 4

The difference between the radio frequency power amplifier provided in this embodiment and the radio frequency power amplifier provided in embodiment 3 is that one end of the feedback circuit and the output end of the last stage amplification circuit are connected to the second node, and under the condition that the feedback loop forming a 180°+360°×n phase shift, the other end of the feedback circuit is connected to the input end of a certain stage amplification circuit in front of the last stage amplification circuit to the first node. Among them, the number of amplification circuits in the plurality of levels of amplification circuit shall not be less than 2.

Figure 8:
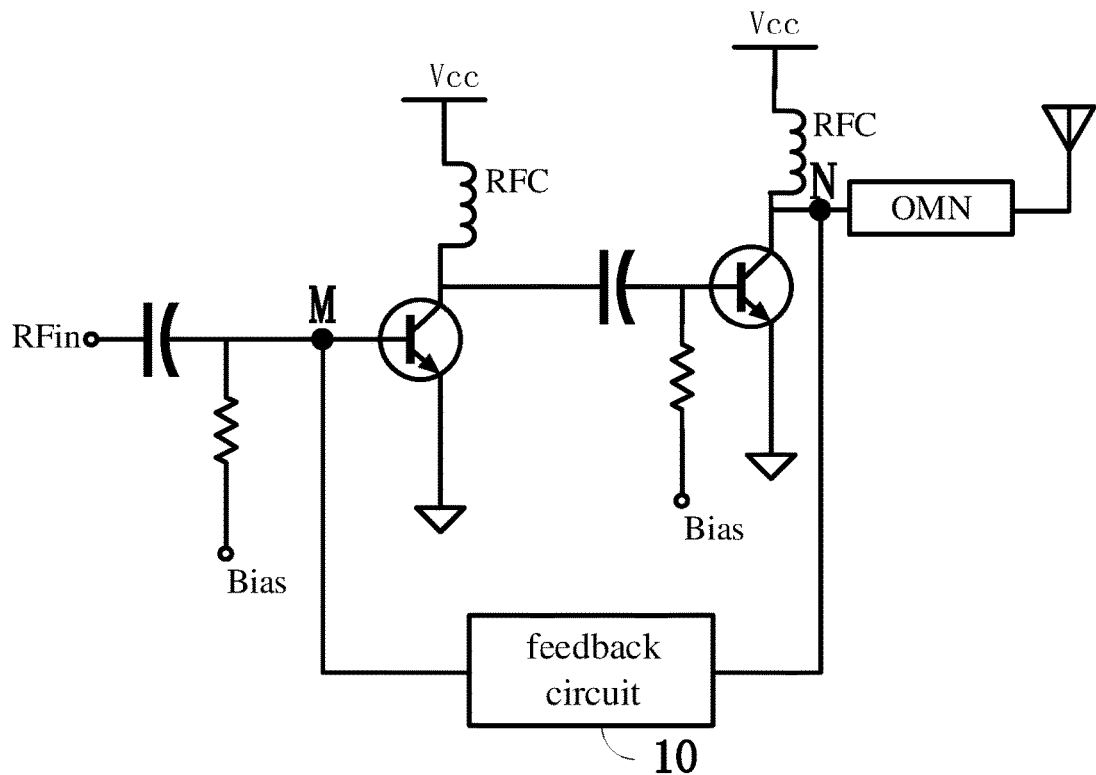
FIG. 8 is a schematic diagram of the radio frequency power amplifier that reduces load change sensitivity provided by embodiment 4 of the present disclosure.

As shown in FIG. 8, the radio frequency power amplifier provided by this embodiment comprises a two-stage amplification circuit and a feedback circuit 10. One end of the feedback circuit 10 is connected with the output end of the second stage amplification circuit to the second node N, and under the condition that the feedback loop forming a 180°+360°×n phase shift, the other end of the feedback circuit 10 and the input end of the first stage amplification circuit are connected to the first node M.

The structure of the feedback circuit 10 is the same as that of the feedback circuit 10 in embodiment 1. The working principle of the radio frequency power amplifier provided in this embodiment is the same as that in embodiment 1, and will not be repeated here.

Figure 9:
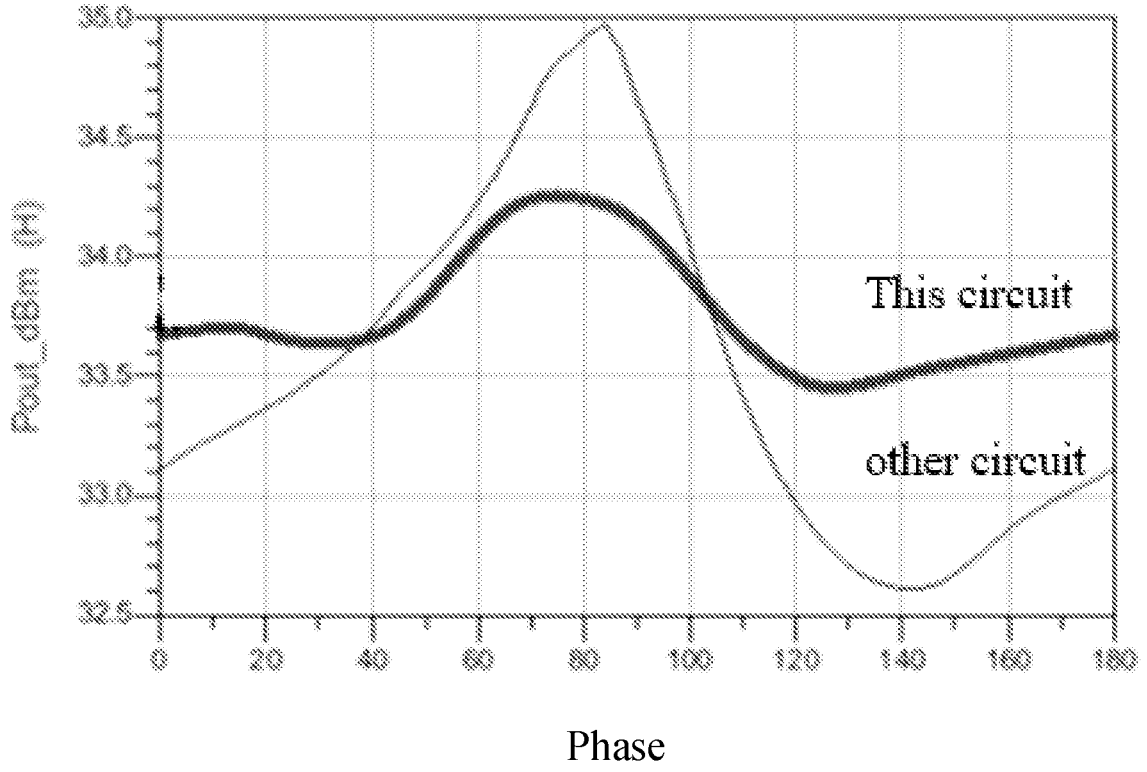
FIG. 9 is a comparison diagram of simulation results of stable output power of radio frequency power amplifier with load change provided by the embodiment of the present disclosure.

Taking the voltage standing wave ratio (VSWR) of the load as an example, the radio frequency power amplifier is simulated. As shown in FIG. 9, it is not difficult to find that the fluctuation of the available power of the radio frequency power amplifier under different phases is significantly reduced, thus reducing the sensitivity of the radio frequency power amplifier to the change of load impedance.

In addition, the radio frequency power amplifier that reduces load change sensitivity provided in the embodiment of the present disclosure can be used in an integrated circuit chip. The specific structure of the radio frequency power amplifier which reduces load change sensitivity in the integrated circuit chip will not be detailed here.

The radio frequency power amplifier which reduces load change sensitivity can also be used in the communication terminal as an important part of the radio frequency integrated circuit. The communication terminal mentioned here means that it can be used in the mobile environment and supports GSM, edge and TD_SCDMA, TDD_LTE, FDD_LTE and other computer equipment with various communication systems, including mobile phones, laptops, tablets, car computers, etc. In addition, the technical scheme provided by the present disclosure is also applicable to other radio frequency integrated circuit applications, such as communication base stations.

The radio frequency power amplifier reducing load change sensitivity provided by the present disclosure adds a feedback circuit on the basis of the existing radio frequency power amplifier. The feedback circuit uses passive components and selects appropriate feedback points. On the basis of 360° phase shift formed by the amplification devices between the feedback loops, the feedback loop is used to form $180°+360°\times n$ phase shift, so as to stabilize the output power of the radio frequency power amplifier, reduce the sensitivity of the radio frequency power amplifier to the change of load, so as to well stabilize the total radiation power of the radio frequency power amplifier under the change of load.

The radio frequency power amplifier, chip and communication terminal that reduces load change sensitivity provided by the present disclosure are described in detail above. For those skilled in the art, any obvious changes made to the present disclosure without departing from the essence of the present disclosure will fall within the protection scope of the patent right of the present disclosure.

What is claimed is:

1. A radio frequency power amplifier, comprising a feedback circuit and a plurality of stages of amplification circuit, the feedback circuit and all or a portion of amplification circuit among the plurality of stages of amplification circuit being connected in parallel between a first node and a second node, and a feedback loop made up of the feedback circuit and an amplification circuit main path located between the first node and the second node forming a $180°+360°\times n$ phase shift, where n is a natural number; wherein each stage of amplification circuits is composed of an amplification device, and adjacent stages of the plurality of stages of amplification circuits are connected in series with interstage capacitance;

two amplification devices of the plurality of stages of amplification circuits are arranged between the first node and the second node to form a 360° phase shift;

the interstage capacitance between the two amplification devices which are arranged between the first node and the second node, and a feedback capacitance in the feedback circuit forms a 180° phase shift; and when a load impedance changes, a current flowing to the feedback circuit at the second node fluctuates, thereby changing a phase of a feedback current at the first node to dynamically adjust a size of a combined net input current.

2. The radio frequency power amplifier according to claim 1, wherein:

a radio frequency current input to the first node and a feedback current output from the feedback circuit to the first node are in reverse phase under a predetermined load impedance.

3. The radio frequency power amplifier according to claim 1, wherein:

one end of the feedback circuit and an output end of a penultimate stage amplification circuit being connected to the second node, and under a condition that the feedback loop forming a $180°+360°\times n$ phase shift, the other end of the feedback circuit is connected to the first node with the input end of a certain stage amplification circuit in front of the penultimate stage amplification circuit.

4. The radio frequency power amplifier according to claim 1, wherein:

one end of the feedback circuit and an output end of a penultimate stage amplification circuit being connected to the second node, and under a condition that the feedback loop forming a $180°+360°\times n$ phase shift, the other end of the feedback circuit is connected to the first node with the output end of a certain stage amplification circuit in front of the penultimate stage amplification circuit.

5. The radio frequency power amplifier according to claim 1, wherein:

one end of the feedback circuit and an output end of the last stage amplification circuit being connected to the second node, and under a condition that the feedback loop forming a $180°+360°\times n$ phase shift, the other end of the feedback circuit is connected to the first node with the output end of a certain stage amplification circuit in front of the last stage amplification circuit.

6. The radio frequency power amplifier according to claim 1, wherein:

one end of the feedback circuit and an output end of the last stage amplification circuit being connected to the second node, and under a condition that the feedback loop forming a $180°+360°\times n$ phase shift, the other end of the feedback circuit is connected to the first node with the input end of a certain stage amplification circuit in front of the last stage amplification circuit.

7. An integrated circuit chip, comprising the radio frequency power amplifier according to claim 1.

8. A communication terminal, comprising the radio frequency power amplifier according to claim 1.

* * * * *